Oct. 28, 1958 T. O. STANLEY 2,858,379

HIGH INPUT IMPEDANCE TRANSISTOR AMPLIFIER CIRCUITS

Filed Oct. 1, 1954

INVENTOR.
THOMAS O. STANLEY
BY
H. D. Newton
ATTORNEY

United States Patent Office 2,858,379

Patented Oct. 28, 1958

2,858,379

HIGH INPUT IMPEDANCE TRANSISTOR AMPLIFIER CIRCUITS

Thomas O. Stanley, Princeton, N. J., assignor to Radio Corporation of America, a corporation of Delaware Application October 1, 1954, Serial No. 459,727

11 Claims. (Cl. 179—171)

Figure 1:
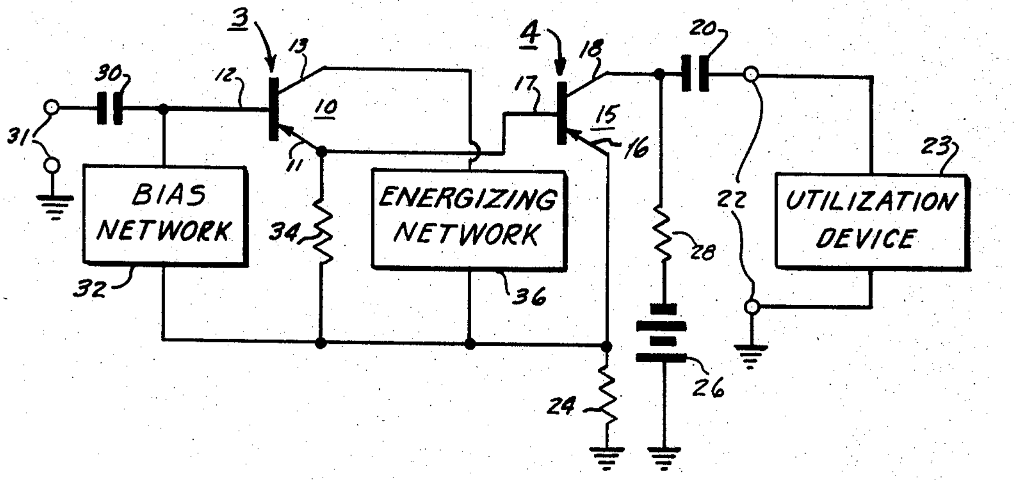

This invention relates generally to signal amplifier circuits and relates in particular to signal amplifier circuits utilizing semiconductor devices and having a high input impedance.

Signal amplifier circuits utilizing vacuum tubes as extensively used in the past may be conveniently arranged to provide a high input impedance. Signal sources for use with these circuits were accordingly designed to take advantage of this high input impedance. The crystal phonograph cartridge which is arranged to provide a substantially uniform frequency response when working into a high impedance load is an example of such a signal source. There are of course many other signal sources which are particularly adaptable to be connected to signal amplifier circuits having high input impedance.

Semiconductor devices or transistors have many well known advantages over the vacuum tube for use in signal amplifier circuits. Some of these advantages are the greater reliability, superior mechanical stability, greater efficiency and small size. Unfortunately, most transistors exhibit a low input impedance when connected to provide amplification in the usual manner. Various methods have been tried for obtaining high input impedance in transistor signal amplifier circuits. One such method is to connect a series resistor between the signal source and the transistor amplifier, in order to prevent loading of the source by the amplifier. The series resistor, however, attenuates the signal thereby reducing the total amplification. This attenuation occurs before the signal is applied to the transistor amplifier, thereby increasing the noise factor of the system, or in other words, causing the signal to noise ratio to be degraded.

Another method for obtaining high input impedance in a transistor signal amplifier circuit has been to utilize the grounded collector connection of the transistor. The input impedance of a circuit of this type is approximately equal to the load impedance connected to the emitter electrode or output terminal multiplied by the current amplification factor. The impedance of the collector junction of the transistor is in shunt with the input circuit, and imposes an upper limit on the input impedance which may be obtained. Furthermore, the bias network connected with the bias or input electrode will also shunt the input impedance. If the impedance of the bias network is made large in order to obtain high input impedance, the stability of the direct current operating point of the transistor may be relatively poor. Thus, interchangeability of transistors in a circuit of fixed components may also be poor. The reason for this fact is that the well-known requirement for operating point stability of keeping the base circuit resistance low has not been met.

It is, therefore, a primary object of the present invention to provide an improved signal amplifier circuit which may efficiently utilize semiconductor devices to provide a high impedance input circuit.

It is a further object of the present invention to provide an improved transistor signal amplifier circuit having both high input impedance and high signal to noise ratio.

It is a still further object of the present invention to provide an improved transistor signal amplifier circuit having high input impedance wherein variations in the output load impedance have a negligible effect upon the input impedance.

It is further an object of the present invention to provide an improved signal amplifier circuit utilizing transistors wherein the direct current operating point is stabilized against changes due to variations in temperature and transistor characteristics.

An amplifier circuit in accordance with the present invention comprises a pair of transistor amplifier stages connected in cascade relation, the first of which is operated as a base input, emitter output amplifier, and the second of which is operated as a base input, collector output amplifier. A degenerative impedance element is connected between the emitter electrode of the second stage and a point of substantially fixed reference potential or ground, so that the signal voltage appearing at this emitter electrode is substantially the same as the input voltage applied to the base electrode of the first stage.

The collector electrode of the transistor of the first stage and a bias network connected with the base electrode of the first stage are returned at signal frequencies to the emitter electrode of the second transistor. An output circuit is connected between the collector electrode of the second stage transistor and ground. Since the bias network and the collector electrode of the transistor of the first stage are driven by a voltage substantially equal to the input voltage, neither the bias network nor the collector resistance of the first stage transistor will appreciably load the input circuit. The input impedance of the amplifier is thereby raised. Furthermore, the impedance level of the bias network may be made relatively low, thereby to stabilize the operation of the first stage transistor without excessive input circuit loading. Another advantage of the circuit of the present invention is that the load is conveniently placed in the collector electrode circuit of the second stage transistor where load variations have an essentially negligible effect upon the input impedance.

Figure 2:
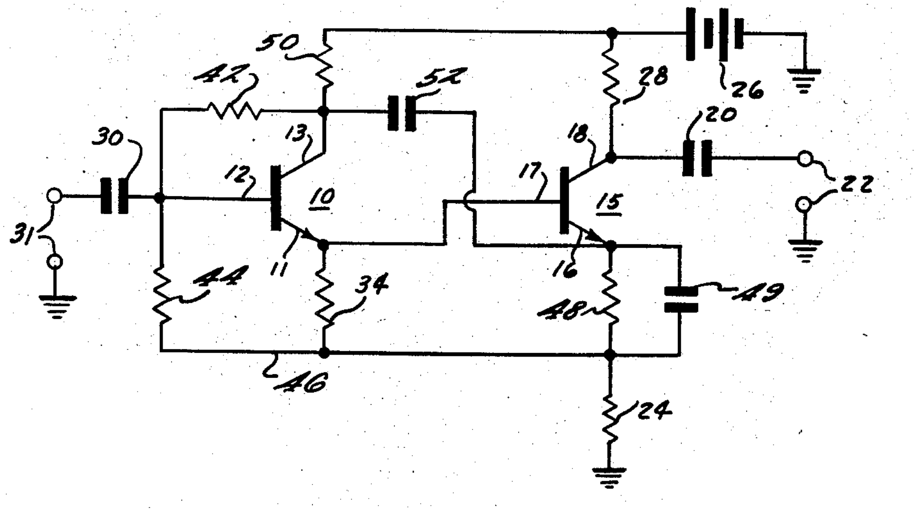

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of an amplifier circuit embodying the present invention; and Figure 2 is a modification of the circuit illustrated in Figure 1, also embodying the present invention.

Referring now to the drawing wherein like elements are designated by like reference numerals in both figures and referring particularly to Figure 1, a two stage transistor signal amplifier circuit comprises a first signal amplifier stage 3 and a second signal amplifier stage 4. The signal amplifier circuit may, by way of example, be an audio frequency phonograph signal amplifier circuit, although it should be understood that the invention and application are not restricted to audio frequency signal amplification. Each of the amplifying stages 3 and 4 is provided with a semiconductor device or transistor 10 and 15 respectively. The transistor 10 includes an emitter electrode 11, a base electrode 12 and a collector electrode 13 while the transistor 15 includes an emitter electrode 16, a base electrode 17 and a collector electrode 18. These transistors will be referred to hereinafter as the input transistor 10 and the output transistor 15. The input transistor 10 and the output transistor 15 are illustrated as being of the P–N–P type although it should be understood that by reversing the polarities, N–P–N type transistors will work equally well. The collector electrode 18 is coupled through a coupling capacitor 20 to one of a pair of output terminals 22 to which a utilization device may be connected. This utilization device, for example, may be the input circuit of an additional stage of signal amplification. The other of the pair of output terminals 22 is connected to a point of substantially fixed reference potential or ground. The emitter electrode 16 is returned to ground through a degenerative impedance element illustrated as a resistor 24. Energizing current is supplied to the output transistor 15 by means of a source of energizing potential illustrated as a battery 26 and a load impedance element, illustrated as a resistor 28, connected in series between the collector electrode 18 and ground. The base electrode 17 is connected to the emitter electrode 11 in order to derive signals therefrom.

Input signals to the signal amplifier circuit are applied to a pair of input terminals 31 one of which is connected to ground, and the other of which is coupled to the base electrode 12 through a coupling capacitor 30. A bias network 32 providing means for biasing the emitter electrode 11 in a forward direction relative to the base electrode 12 is coupled between the base electrode 12 and the emitter electrode 16. A coupling network illustrated as a coupling resistor 34 is connected between the emitter electrodes 11 and 16. An energizing network 36 which provides means for biasing the collector electrode 13 in a reverse direction relative to the base electrode 12 is connected between the collector electrode 13 and the emitter electrode 16.

Input signal current flowing into the base electrode 12 will be amplified by the transistor 10, thereby to cause an amplified signal current to flow from the emitter electrode 11 into the base electrode 17. This signal current is in turn amplified by the output transistor 15 and will cause a signal current to flow into the output circuit through the pair of output terminals 22 and into the utilization device 23. This signal current flowing through the emitter resistor 24 will cause a signal voltage to appear between the emitter electrode 16 and ground. This voltage approaches but is always less than the input voltage applied to the pair of input terminals 31.

If the input impedance of the first stage 3 is to be high in value, the input current flowing into the base electrode 12 must be kept small, and in addition, the input current flowing into the bias network 32 must also be kept small.

Since the signal voltage on the emitter electrode 16 of the second stage 4 is almost equal to the signal input voltage, the signal voltage across the bias network 32 is very low. Consequently, the bias network 32 draws very little signal current and does not appreciably load the input circuit. The energizing network for the collector electrode 13 will in like manner draw very little signal current since it is also returned to the emitter electrode 16 of the second stage 4. Thus signal current flowing across the collector junction of the transistor 10 will be extremely small. The input current to the amplifier therefore consists almost solely of current flowing across the emitter junction between the base electrode 12 and the emitter electrode 11. This current is small relative to the signal current flowing through the emitter resistor 24, by virtue of the aforementioned amplification. The ratio of the input signal voltage to the input signal current is then greater than the resistance of the emitter resistor 24 by a factor equal to this current amplification. Thus by a novel cascade arrangement of two transistors, a high impedance input circuit is provided.

Referring now to Figure 2, a practical method of achieving the performance of the circuit of Figure 1 includes a pair of transistors 10 and 15. The input transistor 10 has its base electrode 12 coupled through the coupling capacitor 30 to one of a pair of input terminals 31, the other of which is connected to ground. The collector electrode 13 is connected to a source of energizing potential illustrated as a battery 26 through a load resistor 50. Bias is applied to the base electrode 12 by means of a bias network consisting of a resistor 42 connected between the collector electrode 13 and the base electrode 12 and a resistor 44 connected between the base electrode 12 and a common circuit point 46 to which the emitter resistor 34 of the input transistor 10 is also connected.

The emitter electrode 11 of the input transistor 10 is connected to the base electrode 17 of the output transistor 15 to provide signal translation thereto. The collector electrode 18 is connected to the battery 26 through the load resistor 28. Output signals are coupled from the collector electrode 18 through a coupling capacitor 20 to one of a pair of output terminals 22, the other of which is connected to ground. The emitter electrode 16 is connected to the common circuit point 46 through the parallel combination of a bias resistor 48 and a bypass capacitor 49. The purpose of the resistor 48 is to provide for the establishment of an appropriate direct current bias condition for the output transistor 15. The bypass capacitor 49 causes signal voltage at the common circuit point 46 to be the same as the potential of the emitter electrode 16 at signal frequencies.

The collector electrode 13 is coupled to the emitter electrode 16 by a coupling capacitor 52 which causes the collector eletrode 13 to be driven at signal frequencies by the potential appearing at the emitter electrode 16. Also, as in the case of the circuit of Figure 1, a bias network connected with the base electrode 12 is driven from the emitter electrode 16 of the output transistor 15. The circuit of Figure 2 therefore affords high input impedance with the use of a single battery supply in a relatively simple circuit arrangement.

By way of example, the following circuit specifications were used for a circuit of the type illustrated in Figure 2 to obtain an input impedance of 500,000 ohms:

| | |
|---|---|
| Battery **26** | 6 volts. |
| Resistors 24; 28; 34; 42; 44; 48; and **50** | 2,000; 5,000; 5,000; 50,000; 50,000; 5,500; and 5,000 ohms, respectively. |
| Capacitors **49** and **52** | 30 and 10 microfarads, respectively. |

A signal amplifier circuit which effectively utilizes semiconductor devices to provide high input impedance is thus made possible by the present invention. The use of series impedance elements which may degrade the signal to noise ratio is avoided. Variations in the output load impedance have very little effect upon the input impedance of the circuit because of the high degree of isolation provided by the output transistor. Stability of the direct current operating point is assured by the stabilizing networks coupled with each transistor stage.

What is claimed is:

1. A signal amplifier circuit providing a high input impedance comprising in combination, a first and a second semiconductor device, each including base, emitter and collector electrodes, said first semiconductor device being connected in a common collector configuration, said second semiconductor device being connected in a common emitter configuration, said first and second semiconductor devices being connected in cascade relation, energizing means for providing energizing current for said semiconductor devices, an input circuit coupled with the base electrode of said first semiconductor device, an output circuit coupled with the collector electrode of said second semiconductor device, and means providing a common signal circuit return for the base, emitter, and collector electrodes of said first semiconductor device and the emitter electrode of said second semiconductor device including a common impedance element coupled with the base, emitter, and collector electrodes of said first device and the emitter of said second device whereby a high input impedance is provided.

2. A signal amplifier circuit as defined in claim 1, wherein said common signal circuit return means includes a capacitor connected between the collector electrode of said first device and said common impedance element.

3. A signal amplifier circuit as defined in claim 1, wherein said common signal circuit return means includes a resistor connected between the base electrode of said first device and said common impedance element.

4. A signal amplifier circuit as defined in claim 1, wherein said common signal circuit return means includes a direct current conductive impedance element connected between the emitter electrode of said first semiconductor device and said common impedance element.

5. A signal amplifier circuit as defined in claim 4, wherein said direct current conductive impedance element is a resistor.

6. A signal amplifier circuit comprising in combination, a first and a second semiconductor device, each including base, emitter and collector electrodes, said first device being connected in a common collector configuration, said second device being connected in a common emitter configuration, means coupling said first and second devices in cascade relation, energizing means for providing energizing current for said devices, an input circuit coupled with the base electrode of said first device, an output circuit coupled with the collector electrode of said second device, a degenerative resistor connected between the emitter of said second semiconductor device and a point of reference potential in said circuit, and means coupling the base, emitter, and collector electrodes of said first device with the junction of said resistor and the emitter of said second device to provide a high input impedance for said amplifier circuit.

7. A signal amplifier circuit as defined in claim 6, wherein said coupling means includes a direct connection between the emitter electrode of said first device and the base electrode of said second device.

8. A signal amplifier circuit as defined in claim 7, wherein said last named means further includes a coupling impedance element connected between said emitter electrodes.

9. A signal amplifier circuit as defined in claim 8, wherein said coupling impedance element is a resistor.

10. A signal amplifier circuit comprising in combination, a first and a second transistor connected in cascade relation, each of said transistors including base, emitter and collector electrodes, input circuit means coupled with the base electrode of said first transistor, output circuit means coupled with the collector electrode of said second transistor, a bias network connected between the base electrode of said first transistor and the emitter electrode of said second transistor, an energizing network connected between the collector electrode of said first transistor and the emitter electrode of said second transistor, a coupling impedance element connected between said emitter electrodes, means connecting the emitter electrode of said first transistor and the base electrode of said second transistor for providing signal translation therebetween, and an impedance element connected to the emitter electrode of said second transistor for providing a signal voltage at the emitter electrode of said second transistor in response to input signals from said input circuit means.

11. A relatively high input impedance signal amplifying circuit comprising in combination, a first and second transistor each including base, emitter, and collector electrodes, means for applying biasing potentials to said transistors including a source of potential having a pair of terminals, means connecting the collectors of said first and second transistors with one of said terminals of said source, means including a degenerative resistor connecting the emitter of said second transistor with the other terminal of said source, means providing an input circuit connected for applying an input signal to the base of said first transistor, means including a coupling resistor connecting the emitter of said first transistor to the junction of said degenerative resistor and the emitter of said second transistor, means connecting the junction of the emitter of said first transistor and said coupling resistor with the base of said second transistor for deriving an output signal from the emitter of said first transistor and applying said signal to the base of said second transistor, means connecting the base of said first transistor with the junction of the emitter of said second transistor and said degenerative resistor, means providing a signal conveying connection between the collector of said first transistor and the emitter of said second transistor, and means for deriving an output signal from the collector of said second transistor.

References Cited in the file of this patent

UNITED STATES PATENTS 2,662,124 McMillan -------------- Dec. 8, 1953

OTHER REFERENCES

Shea text, "Principles of Transistor Circuits," pages 80–82, 97–130, 351; pub. 1953 by John Wiley & Sons, Inc., N. Y. C.